United States Patent [19]

Barbu et al.

[11] Patent Number: 4,903,115

[45] Date of Patent: Feb. 20, 1990

[54] METHOD OF MANUFACTURING CONDUCTIVE ELECTRODES FOR A CIRCUIT ELEMENT, AND SEMICONDUCTOR DEVICE THUS OBTAINED

[75] Inventors: Stefan Barbu; Claude E. Chapron, both of Caen, France

[73] Assignee: U.S. Philips Corporation, New York, N.Y.

[21] Appl. No.: 119,609

[22] Filed: Nov. 12, 1987

Related U.S. Application Data

[62] Division of Ser. No. 841,128, Mar. 18, 1986, Pat. No. 4,749,442.

[30] Foreign Application Priority Data

Mar. 26, 1985 [FR] France .................. 85 04472

[51] Int. Cl.⁴ ........................... H01L 21/223
[52] U.S. Cl. ........................ 357/71; 357/68; 357/65; 437/192
[58] Field of Search .............. 437/192; 357/71, 68, 357/65

[56] References Cited

U.S. PATENT DOCUMENTS

| 4,322,883 | 4/1982 | Abbas | 29/578 |
| 4,381,215 | 4/1983 | Reynolds | 437/192 |
| 4,400,865 | 8/1983 | Goth | 29/571 |

*Primary Examiner*—Andrew J. James
*Assistant Examiner*—David Saltz
*Attorney, Agent, or Firm*—Paul R. Miller

[57] ABSTRACT

The invention relates to semiconductor devices comprising logic, or low-noise, transistors, or transistors for very high frequencies whose structure is improved with respect to the dimensions, the series resistance value, and/or the gain. Such semiconductor devices may be integrated into a semiconductor body having surfaces with contact windows covered with layers of metal combined with the material of the semiconductor body. A multi-collector transistor structure is also formed.

3 Claims, 3 Drawing Sheets

METHOD OF MANUFACTURING CONDUCTIVE ELECTRODES FOR A CIRCUIT ELEMENT, AND SEMICONDUCTOR DEVICE THUS OBTAINED

This is a division of application Ser. No. 841,128, filed Mar. 18, 1986 now U.S. Pat. No. 4,749,442.

The invention relates to a method of manufacturing conductive electrodes for a circuit element in which conductive electrodes are provided in accordance with a desired pattern by using a mask positioned with respect to at least two adjacent contact windows in an insulating layer which is present on a semiconductor body with the adjacent contact windows being located on two adjacent semiconductor surface regions of the circuit element and being laterally separated by at least one narrow region of the insulating layer.

In prior art methods the conductive electrodes are directly deposited on the bare surface of the semiconductor body by covering the insulating layer over the edges of the contact windows in such a way as to allow for a tolerance A of positioning the mask used for the conductive electrodes with respect to the contact windows. The contact windows are always entirely filled by the corresponding conductive electrodes since the conductive electrodes entirely overlap the edges of the underlying contact windows.

The methods described above have the drawback that narrow regions should have a width $E_o$ which is at least equal to $B+2A$, where B is the minimum distance between two conductive electrodes.

The invention has for its object to provide a method in which this width E of the narrow region is less than $B+2A$.

The invention is based on the recognition that prior to the conductive electrodes a metal which chemically combines with the material of the semiconductor surface is provided and that of the two adjacent conductive electrodes at least one only partially covers the corresponding window.

To this end, the method according to the invention is characterized in that it comprises the following steps:

(a) opening contact windows in an insulating layer in such a manner that the narrow region has a nominal width E which is between C and $B+2A$, and which is sufficient to prevent a short-circuit between the two adjacent surface regions caused by bridging the narrow region in extreme positions of the conductive electrodes defined by the tolerance A while allowing for the relative position of the conductive electrodes and the narrow region and it is tolerated that of two adjacent conductive electrodes at least one is susceptible to only partially covering the corresponding contact window, where A = the tolerance of positioning the conductive electrodes with respect to the contact windows on either side of their nominal position, B = the minimum distance between two conductive electrodes, C = the minimum width of the narrow region of the insulating layer realizable by photo-etching techniques, (b) providing a metal chemically combining with the surface material of the semiconductor body in the contact windows such that the bare surface of the semiconductor body in the contact windows are covered with a combined metal layer.

(c) Providing the conductive electrodes in accordance with the desired pattern with the aid of the mask.

The metal which chemically combines with the surface material of the semiconductor body may be, for example, Pt or Pt-Ni.

Between steps (a) and (b) the method may comprise a step of providing at least one of the semiconductor surface regions for a circuit element. Preferably the circuit element is a transistor.

Preferably, the method according to the invention is further characterized in that the conductive electrodes have a width which is at least equal to that of the corresponding contact windows and that under nominal conditions the mask if arranged in such a manner that at least a boundary of each conductive electrode susceptible of only partially covering the corresponding window coincides with the edge of the corresponding contact window contiguous to the narrow region of the insulating layer, and that the nominal value E of the narrow region is at least equal to the higher of two values defined by $$A(3-p) \text{ and } B+(2-p)A,$$

where p = integer equal to 1 or 2 depending on to whether it is tolerated that of two adjacent conductive electrodes, one or both may only partially cover the corresponding contact windows.

In a further embodiment of the method according to the invention, the circuit element is a transistor for high frequencies or low noise in which, for preserving a minimum emitter contact resistance, a partial covering is only tolerated for two conductive base electrodes situated on either side of an emitter (p = 1m) with the emitter contact window adjoining two narrow regions that laterally borders the emitter contact window and in which in the nominal position the conductive emitter electrode overlaps these narrow regions on either side by a quantity A and the conductive base electrodes entirely fill the base contact windows in the nominal position. In this manner a transistor is obtained which has reduced dimensions that are much smaller than in the prior art.

In another embodiment of the method according to the invention the integer p is chosen to be 2 and the insulating layer comprises both a base contact window and an emitter contact window of a transistor, and for obtaining a minimum base resistance, the minimum width of the portions of conductive electrodes, which portions in each of the contact windows are located on the semiconductor surface regions, is equal to a given value G; and the width of the contact windows and of the conductive emitter and base electrodes is equal to $A+G$. This arrangement is particularly interesting for the emitter electrodes. Therefore a value $G_1$ can be taken for the emitter and a value $G_2$ for the base.

In a modification particularly envisaging minimum lateral dimensions, each conductive electrode which is susceptible of only partially covering the corresponding contact window has a width less than that of the corresponding contact window.

According to an advantageous form of the method according to the invention the nominal value E of the narrow region is at least equal to $2A - (p - 1) B$, where p = an integer equal to 1 or 2, depending on whether it is tolerated that of two adjacent conductive electrodes one of them, or both, may only partially cover the corresponding contact windows. If this value E is less than C(where C=minimum width of the narrow region as determined by the photo-etching technique used to provide the contact windows), the value C is chosen.

The transistor may advantageously be of the multicollector type as is often used in integrated circuits of the injection logic (I²L) type and in which type p=2 where the contact windows may be collector contact windows and/or contact windows for the transistor base region or the injector.

The invention also relates to a semiconductor device comprising at least one transistor for operation at very high frequencies integrated in a semiconductor body and comprising an insulating layer provided on a surface of the semiconductor body which insulating layer has at least two adjacent contact windows, one for the emitter region and the other for the base region with the contact windows being laterally separated by a narrow region of the insulating layer, and having conductive emitter and base electrodes disposed in the contact windows, and which is characterized in that the surfaces in the contact windows are entirely covered with layers of metal combined with the material of the semiconductor body, in that the conductive emitter electrode entirely covers the emitter contact window and therefore has a width exceeding the width of the emitter contact window by a quantity 2A, in that the distance between the conductive emitter and base electrodes is equal to a quantity B and in that the width E of the narrow region of the insulating layer is at least equal to one of the two values 2A and A+B, and is less than 2A+B.

Furthermore, the invention relates to a semiconductor device comprising at least one transistor integrated in a semiconductor body and comprising an insulating layer provided on a surface of the semiconductor body, which insulating layer has two adjacent contact windows, one for the emitter region and the other for the base region, with the contact windows being laterally separated by a narrow region of the insulating layer, and having conductive emitter and base electrodes disposed in the contact windows, and which is characterized in that the surfaces in the windows are entirely covered with layers of metal combined with the material of the semiconductor body and in that the narrow region has a width E which is equal to the distance B between the conductive emitter and base electrodes.

Finally the invention relates to a semiconductor device comprising at least one multicollector I² L transistor structure integrated in a semiconductor body and comprising an insulating layer provided on a surface of the semiconductor body and which has at least two collector contact windows which are laterally separated by a narrow region of the insulating layer and conductive collector electrodes disposed in the contact windows, and which is characterized in that the surfaces in the contact windows are entirely covered with a layer of metal combined with the material of the semiconductor body and in that the distance B between the conductive collector electrodes is greater than the width E of the narrow region.

The invention will now be described by way of example with reference to the drawing.

Figure 1:
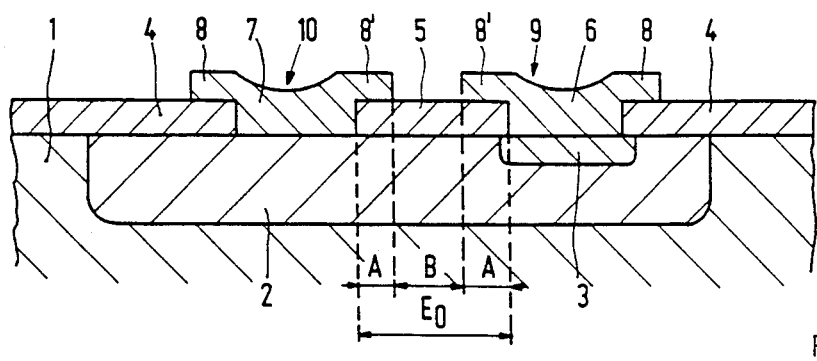
FIG. 1 shows a prior art transistor in which the conductive electrodes are shown in their nominal position.

In FIG. 1 a prior art transistor is formed on a semiconductor body or substrate 1 of a first conductivity type and comprises a diffused or implanted base region 2 of a second conductivity type opposite to the first conductivity type and a diffused or implanted emitter region 3 in a part of the base region 2 and having conductive emitter electrode 6 and base electrode 7 arranged in the contact windows 9 and 10, respectively, of an insulating layer 4, with the contact window 9 serving also for realization of the emitter region. In their nominal position the conductive electrodes 6 and 7 laterally overlap at 8 on either side on the insulating layer 4 by a distance or quantity A. This quantity A is at least equal to the positioning tolerance of the conductive electrodes 6 and 7 on either side of their nominal position and which causes the contact windows 9 and 10 to be entirely covered with the conductive electrodes 6 and 7, respectively. If the reference B indicates the minimum distance between two conductive electrodes, the narrow region 5 of the insulating layer 4 separating the contact windows 9 and 10 thus has a width $E_o$ which is at least equal to B+2A.

For example, for A=1.75 microns and B=2.5 microns, $E_o \geq 6$ microns.

In FIGS. 2a to 2d the impurities for the emitter region 3 are provided through a window 11 which is separated from a base contact window 12 by a narrow region 25 having a width E of less than B+2A.

Figure 2A:
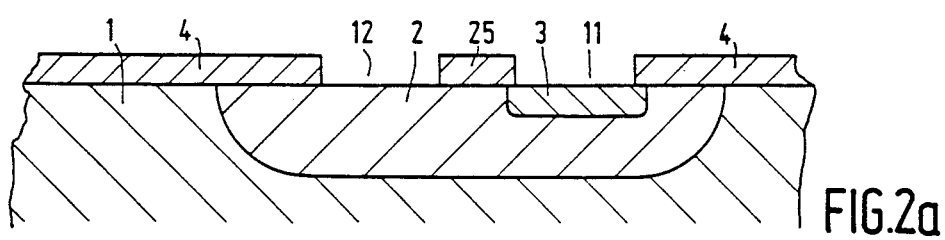
FIGS. 2a to 2d illustrate the steps of the method according to the invention.

FIG. 2a shows the arrangement in the last stage which also occurs in the prior art methods, except for the width of the narrow region 25, that is to say, after providing the emitter region 3 through the window 11.

Figure 2B:
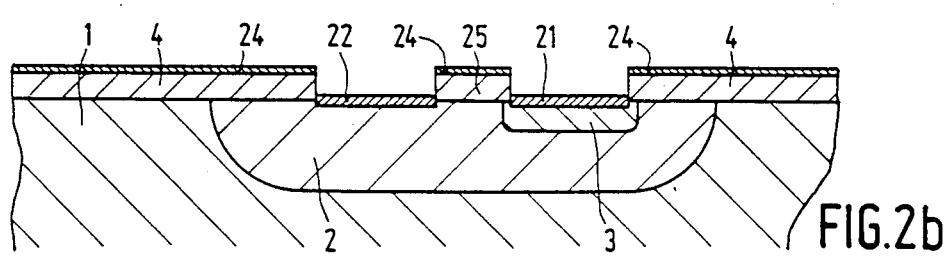
Figure 2C:
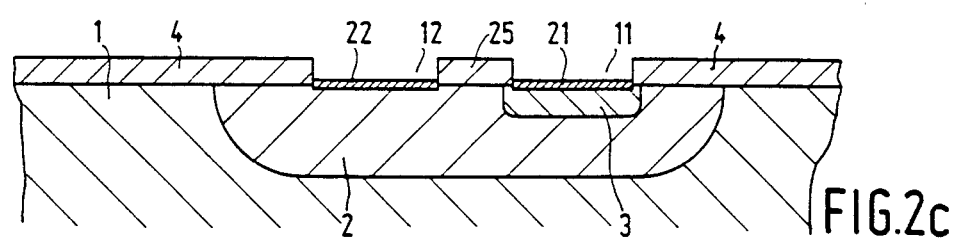
Figure 2D:
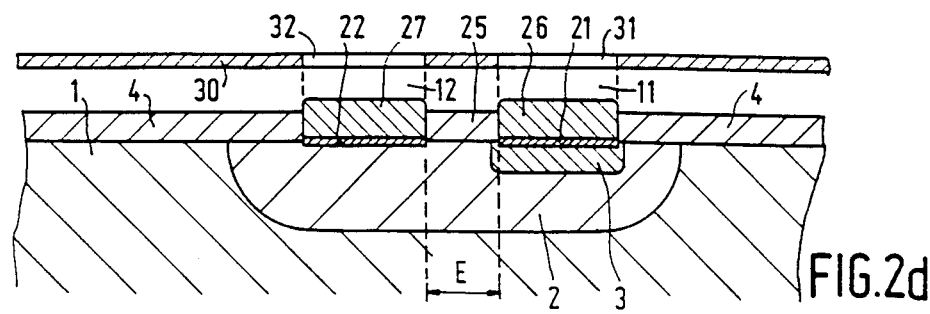

In FIG. 2b approximately 500 Å of Pt or of Pt-Ni is provided on the insulating layer 4 and on the bare surface of the semiconductor body in the contact windows 11 and 12 in a manner of providing an alloy for forming a silicide layer of Pt denoted by the reference numeral 21 for the emitter region 3 and 22 for the base region 2, whereas the insulating layer 4 is covered with a noncombined metal layer 24 of Pt or Pt-Ni as the case may be. This step is known in itself and is usually utilized for realizing Schottky contacts. It is to be noted that the Schottky effect is avoided in known manner when the surface of the semicoductor body is highly doped (for example $10^{20}/cm^2$) irrespective of whether the semiconductor zone itself is highly doped (for example, the emitter zone) or whether a highly doped superfical layer is realized.

The subsequent step (FIG. 2c) consists of selectively removing the layer 24 with the aid of a solution commonly used in semiconductor technology.

The final step (FIG. 2d) consists of realizing in known manner conductive emitter 26 and base electrodes 27 having a thickness of approximately 1 micron. These conductive electrodes 26 and 27 have the same width in the example chosen as the contact windows 11 and 12, respectively, and in their nominal position they entirely fill these windows as shown.

Figure 3A:
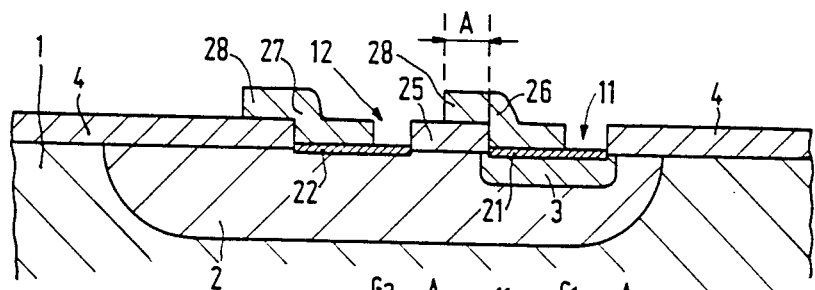
FIGS. 3a and 3b show the extreme positions that can be occupied by the conductive electrodes of the transistor of FIG. 2d within the tolerance limits A on either side of the nominal position.
Figure 3B:
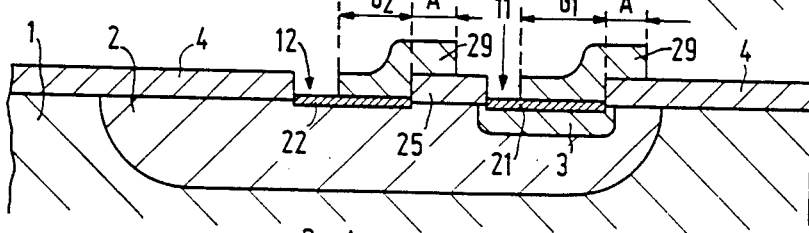

FIGS. 3a and 3b illustrate the extreme case of positioning the conductive electrodes 26 and 27 with respect to the contact windows 11 and 12 with possibilities of covering the insulating layer 4 (part 28) and the narrow region 25 (part 29) over a distance A. It can be seen that if the width E of the narrow region 25 is more than or equal to A, there can be no short-circuit between the emitter region 3 and the base region 2 by bridging of the narrow region 25 by one or the other conductive electrode 26 or 27.

If on the other hand in the manufacturing process one has B>A, which is generally the case, then one chooses E=B.

Summarizing, in case it is tolerated that the two adjacent conductive electrodes may only partially cover the corresponding contact windows, E may be chosen to be at least equal to the higher of two values A and B, which value is generally higher than the value C (C=minimum width of the narrow region as determined by the photo-etching technique used to provide the contact windows 11 and 12).

For example, for A=1.75 microns, B=2.5 microns and C=2 microns we have E=2.5 microns instead of $E_o$=6 microns.

This reduction in the width E of the narrow region 25 with respect to the value $E_o$ of the prior art permits of reducing the intrinsic resistance $R_b$ of the base region. On the other hand, if this advantage is to be preserved entirely for the conductive electrodes 26 and 27, they should have a minimum covering distance G, denoted by $G_1$ and $G_2$ for the corresponding windows 11 and 12, respectively, in such a manner that the contact resistance is much lower than $R_b$. The width of the windows 11 and 12 then is $G_1$+A and $G_2$+A, respectively, whereas in the prior art the respective values of $G_1$ and $G_2$ might, for example, be satisfactory. In other words the optimization of the value of the base resistance $R_b$ does not necessarily provide a gain in the dimensions of the transistor: the two advantages are not entirely cumulative.

Figure 4:
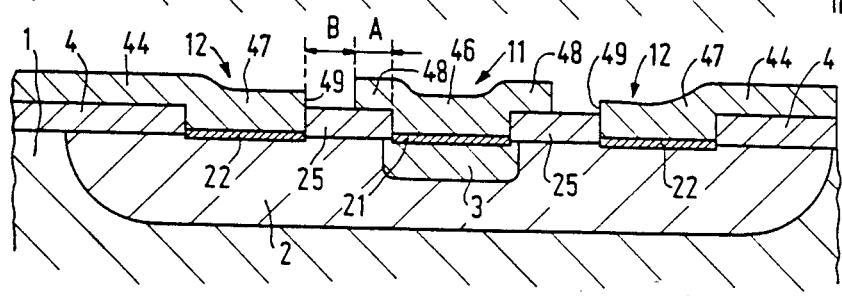
FIGS. 4, 5a and 5b show a hyperfrequency transistor in accordance with the invention, with its conductive electrodes being in the nominal position, to the extreme left and to the extreme right, respectively.
Figure 5A:
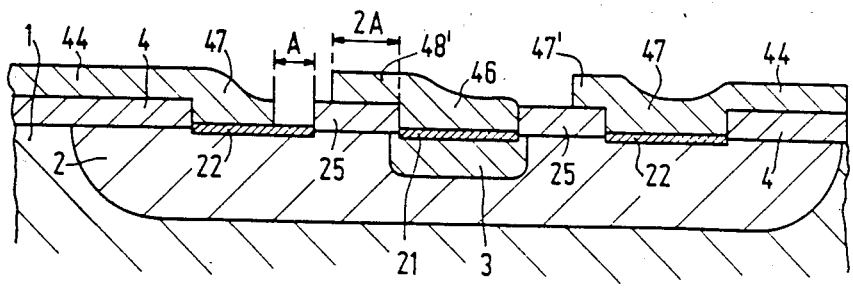
Figure 5B:
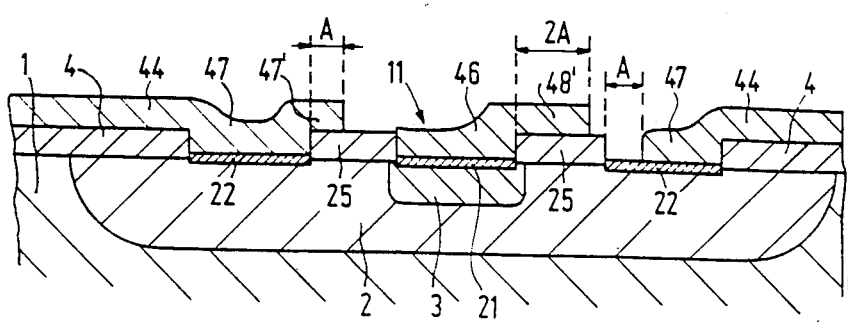

FIGS. 4, 5a and 5b show transistors for high frequencies, notably for hyperfrequencies, which have emitter contacts of excellent quality (combined metal layer 21 and conductive electrode 46), whereas one is less demanding for the base contacts (combined metal layer 22 and conductive electrode 47). This means that under all circumstances the conductive electrode 46 should completely cover the contact window 11 through which window 11 the impurities for the emitter region 3 have been provided, whereas only a partial covering of the base contact windows 12 by the conductive electrodes 47 is tolerated.

In FIG. 4 the conductive electrodes 46 and 47 have their nominal position. The conductive emitter electrode 46 overlaps at 48 by a quantity of A on either side of two narrow regions 25 separating the contact window 11 from the two contact windows 12 each having a conductive base electrode 47. On one side these two conductive base electrodes 47 have an edge 49 contiguous to one of the narrow regions 25. On their opposite sides the conductive base electrodes 47 extend at 44 on the insulating layer 4.

FIGS. 5a and 5b illustrate the extreme positions of the conductive electrodes 46 and 47 with respect to the contact windows 11 and 12 and show that the maximum overlap 48' of the conductive electrode 46 on one or the other narrow region 25 is equal to 2A. Taking into account that the conductive electrodes 46 and 47 are mutually spaced by at least a distance B (see FIG. 4), it can be derived that the width E of the narrow region 25 in this case is at least equal to the higher of two values A+B and 2A. For B>A, which is generally the case, we would thus have E=A+B.

For example, for A=1.75 microns and B=2.5 microns, E could be 4.25 microns.

Figure 6:
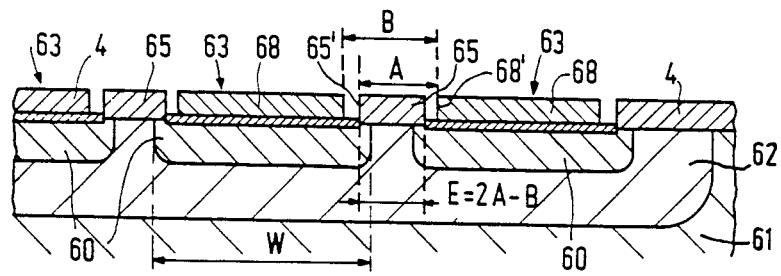
FIGS. 6, 7a and 7b show in partial cross-section a multicollector I²L transistor structure realized in accordance with the invention, with its conductive electrodes being in the nominal position, to the extreme left and to the extreme right, respectively.
Figure 7A:
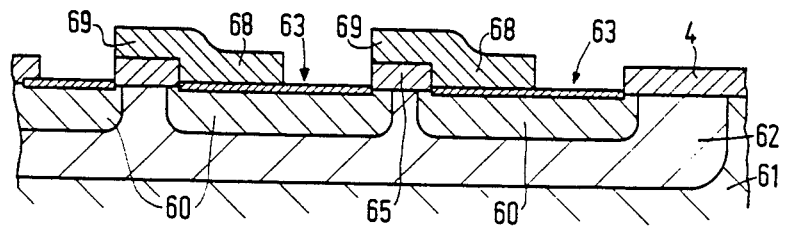

FIGS. 6, 7a ad 7b show logic transistor structures of the $I^2L$ type for a process in which A<B<2A. Such a transistor has an emitter region 61, for example formed by the semiconductor substrate, an impurity doped zone forming a base region 62 and collectors 60 of a given width W which may be diffused or implanted through the windows 63 in the insulating layer 4, The windows 63 are separated by narrow regions 65 of the insulating layer 4.

Figure 7B:
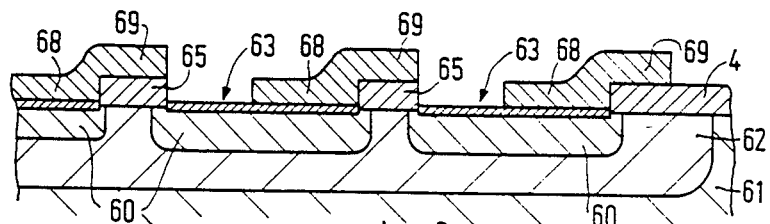

To improve the transistor gain, the ratio between the width of the collector and that of the narrow insulating region may be increased, and in the case when the value of the collector contact resistance need not be optimal it is possible to give the conductive electrodes 68 a width which is less than that of the windows 63, thus accepting that the windows 63 are covered only partially by the conductive electrodes 68. As is shown in FIGS. 7a and 7b, which illustrate the relative extreme positions of the conductive electrodes 68 and windows 63, the edge or edges 68' (FIG. 6) of the conductive electrodes 68 adjacent to a narrow region 65 may be spaced over at least the distance A from the edge 65' (FIG. 6) which is opposite thereto. This condition ensures that the overlapping portions 69 of the conductive electrodes 68 on the narrow regions 65 do not cause a shortcircuit between two adjacent collectors by bridging the narrow regions 65.

For the conductive electrodes 68 spaced by a distance B, there applies that E≦2A-B (and, of course, not smaller than C). For a given width W of the collecors 60 a considerably reduction in the dimensions of the transistor is obtained, which is accompanied by a notable increase in its gain.

For example, for A=1.75 microns and B=2.5 microns, one would have E≦1 microns, hence a value which is much less than $E_o$=6 microns. It is possible to choose a minimum value for E, which is equal to the value C as determined by photo-etching methods. For example, E=C=2 microns.

Figure 8:
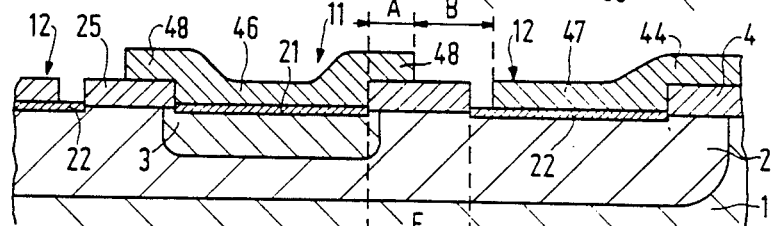
FIGS. 8, 9a and 9b show a hyperfrequency transistor in accordance with the invention, with its conductive electrodes being in the nominal position, to the extreme left and to the extreme right, respectively.
Figure 9A:
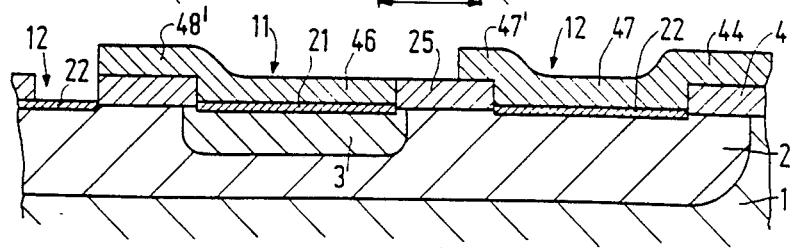
Figure 9B:
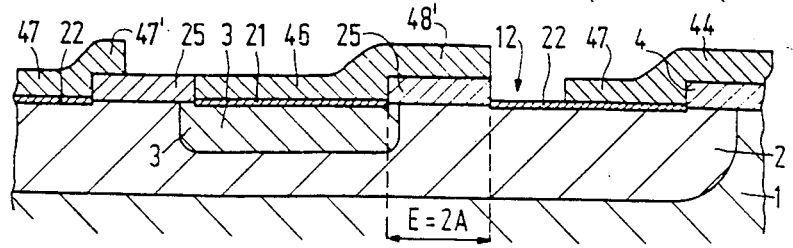

FIGS. 8, 9a and 9b correspond to FIGS. 5, 5a and 5b, in that their nominal position except the conductive base electrodes 47 are spaced from the narrow region 25. As is shown in FIGS. 9a and 9b, which illustrate the extreme relative positions of the metal conductive electrodes 46 and 47 with respect to the contact windows 11 and 12, respectively, E may be given a value which is at least equal to 2A when A<B.

For example, for A=1.75 microns and B=2.5 microns, we have E=3.5 microns instead of A+B=4.25 microns in the case of FIG. 4 and of $E_o$=6 microns in the prior art.

The invention is not limited to the embodiments that have been described and illustrated. The invention is, for example, equally applicable to lateral transistors of the PNP type. As far as the $I^2L$ transistors are concerned, it is also applicable to the conductive electrodes of the base region and the injector region.

What is claimed is:

1. A semiconductor device for a very high frequency transistor comprising a semiconductor body having a surface; an insulating layer disposed on said surface; at least two adjacent contact windows disposed in said insulating layer and extending to said surface; a narrow region of said insulating layer separating said adjacent contact windows, said narrow region having a dimensions E between said contact windows; a layer of a metal chemically combined with said semiconductor body within said contact windows, said layer entirely covering said surface within said contact windows; a base electrode disposed over said layer in one of said contact windows; an emitter electrode disposed over said layer in another of said contact windows, said emitter electrode entirely covering said another contact window, and said emitter electrode having a dimension exceeding the size of said another contact window by a quantity 2A, where A is a tolerance distance of positioning conductive electrodes with respect to said contact windows at either side of a normal position of said conductive electrodes; said emitter electrode and said base electrode separated by a distance B, said distance B being a minimum distance between said two electrodes; wherein said dimension E is at least equal to one of the value 2A or the value A+B, and wherein E is less than 2A+B.

2. A semiconductor device for a transistor comprising a semiconductor body having a surface; an insulating layer disposed on said surface; at least two adjacent contact windows disposed in said insulating layer and extending to said surface; a narrow region of said insulating layer separating said contact windows, said narrow region having a dimension E between said contact windows; a layer of a metal chemically combined with said semiconductor body, said layer entirely covering said surface within said contact windows; a base electrode disposed over said layer in one of said contact windows; an emitter electrode disposed over said layer in another of said contact windows; wherein said dimension E is equal to a distance B between said base and emitter electrodes, and wherein said emitter electrode and said base electrode only partially cover said contact windows.

3. A semiconductor device for a multicollector $I^2L$ transistor comprising a semiconductor body having a surface; an insulating layer disposed adjacently on said surface; at least two collector contact windows disosed in said insulating layer and extending to said surface; a narrow region of said insulating layer separating said collector contact windows, said narrow region having a dimension E between said collector contact windows; a layer of a metal chemically combined with said semiconductor body, said layer entirely covering said surface within said collector contact windows; conductive collector electrodes partially disposed over said layer in said collector contact windows, wherein a distance B between said conductive collector electrodes is greater than said dimension E.

* * * * *